(12) United States Patent
Satomi

(10) Patent No.: US 7,235,855 B2
(45) Date of Patent: Jun. 26, 2007

(54) SEMICONDUCTOR DEVICE HAVING A LAYOUT CONFIGURATION FOR MINIMIZING CROSSTALK

(75) Inventor: Katsuji Satomi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 50 days.

(21) Appl. No.: 11/190,854

(22) Filed: Jul. 28, 2005

(65) Prior Publication Data

US 2006/0028852 A1 Feb. 9, 2006

(30) Foreign Application Priority Data

Aug. 4, 2004 (JP) ............................. 2004-228254

(51) Int. Cl.
*H01L 29/00* (2006.01)

(52) U.S. Cl. .................. 257/508; 257/499; 257/506; 257/E23.151

(58) Field of Classification Search ................ None
See application file for complete search history.

(56) References Cited

U.S. PATENT DOCUMENTS

2003/0038653 A1* 2/2003 Ooishi et al. ................. 326/33

FOREIGN PATENT DOCUMENTS

JP 1-272149 A 10/1989
JP 2001-257266 A * 9/2001

* cited by examiner

*Primary Examiner*—Leonardo Andujar
*Assistant Examiner*—Kevin Quinto
(74) *Attorney, Agent, or Firm*—McDermott Will & Emery LLP

(57) ABSTRACT

Over a memory cell array region of a static RAM (random access memory), dummy wire patterns are formed such that each dummy wire pattern covers 2×2 horizontally and vertically-adjacent intersection points of word lines and bit lines, and horizontally-running wire channels and vertically-running wire channels are formed between the dummy wire patterns in a lattice configuration. Then, a signal line is automatically arranged to extend through any of the wire channels. The dummy wire patterns are provided in a layer lying on the word lines, and the signal line is provided as a metal line extending in the same layer as that of the dummy wire patterns.

6 Claims, 10 Drawing Sheets

SEMICONDUCTOR DEVICE HAVING A LAYOUT CONFIGURATION FOR MINIMIZING CROSSTALK

BACKGROUND OF THE INVENTION

The present invention relates to a semiconductor device which incorporates a memory cell array, such as a static RAM (random access memory), or the like.

The trend of the semiconductor device industry has been such that, in a semiconductor device wherein a system is implemented on a chip, i.e., a so-called system LSI (large-scale integrated circuit), a large capacity semiconductor memory is incorporated in some cases, and a large number of small-capacity semiconductor memories are incorporated in other cases. In view of the chip layout efficiency, it has been demanded to use an area over a memory block as a wire region for signals transferred between logic circuits incorporated together with the memory block and signals transferred between an IO (input/output) pad and the logic circuits. However, a typical layout of such a semiconductor memory is such that word lines used for selection of a memory cell to be accessed and bit lines used for data transmission between memory cells and external devices are arranged to extend over a memory cell array. Therefore, there is a possibility that crosstalk occurs between these lines and signal lines running between the logic circuits over the memory, and the crosstalk causes characteristic deteriorations and malfunctions on the memory side. Especially, in a type of a semiconductor memory wherein a very small potential variation is amplified, the wire layout needs to be such that no coupling capacitance is generated between the bit lines and the signal lines of an overlying layer.

A technique which addresses the above points has been known wherein signal lines of an upper layer are arranged to cross word lines at right angles such that coupling capacitance is unlikely to be generated, and meanwhile, complementary bit line pairs running alongside the signal lines are arranged with equal intervals such that coupling capacitance is uniformly generated between the signal lines and the complementary bit line pairs (see Japanese Laid-Open Patent Publication No. 1-272149). Further, another technique has been known wherein signal lines are provided in a word line backing portion adjacent to a memory cell array (see Japanese Laid-Open Patent Publication No. 2001-257266).

However, Japanese Laid-Open Patent Publication No. 1-272149 does not mention the layout control of signal lines. Especially, a control process for arranging wires with equal intervals with respect to complementary bit line pairs based on an automatic wiring scheme has been generally impossible.

In the technique disclosed in Japanese Laid-Open Patent Publication No. 2001-257266, a memory cell array region, which occupies a considerably large part of a memory block, is covered with a metal pattern, and a wire channel which can pass over the memory block is limited. Therefore, the wiring efficiency is low.

Furthermore, in both of the above techniques, the running direction of signal lines, which run across an upper layer, with respect to the arrangement direction of the memory block is limited, and a rotation arrangement of memory blocks needs to be carried out according to the direction of metal wires which is determined in an automatic wiring process over a semiconductor device. Therefore, there is a high possibility that such decreased arrangement flexibility generates a dead space and causes an area loss. In the case where the layout is designed with a priority given to arrangement of the memory blocks, it is necessary to change metal wire layers at a position immediately before a memory block is traversed. Therefore, an area loss is caused even in this case, and such wiring control requires troublesome efforts, resulting in inefficient production.

SUMMARY OF THE INVENTION

An objective of the present invention is to provide a semiconductor device in which an overlying signal line can be arranged while crosstalk with bit lines and word lines is decreased and which has a layout structure imposing no restriction on a block arrangement rotation and matching the signal line direction on a chip, such that the area loss due to occurrence of a dead space and/or a change of wire layers is reduced.

In order to achieve this objective, the present invention provides a semiconductor device incorporating a memory cell array including a plurality of word lines and a plurality of bit lines crossing each other at right angles, wherein a plurality of dummy wire patterns are provided on the memory cell array so as to cover at least part of the plurality of memory lines (word lines or bit lines), and a signal line extends over the memory cell array through a wire channel formed between the dummy wire patterns.

DESCRIPTION OF THE PREFERRED EMBODIMENTS

Hereinafter, semiconductor devices incorporating static RAMs are described as embodiments of the present invention with reference to the drawings.

Figure 1:
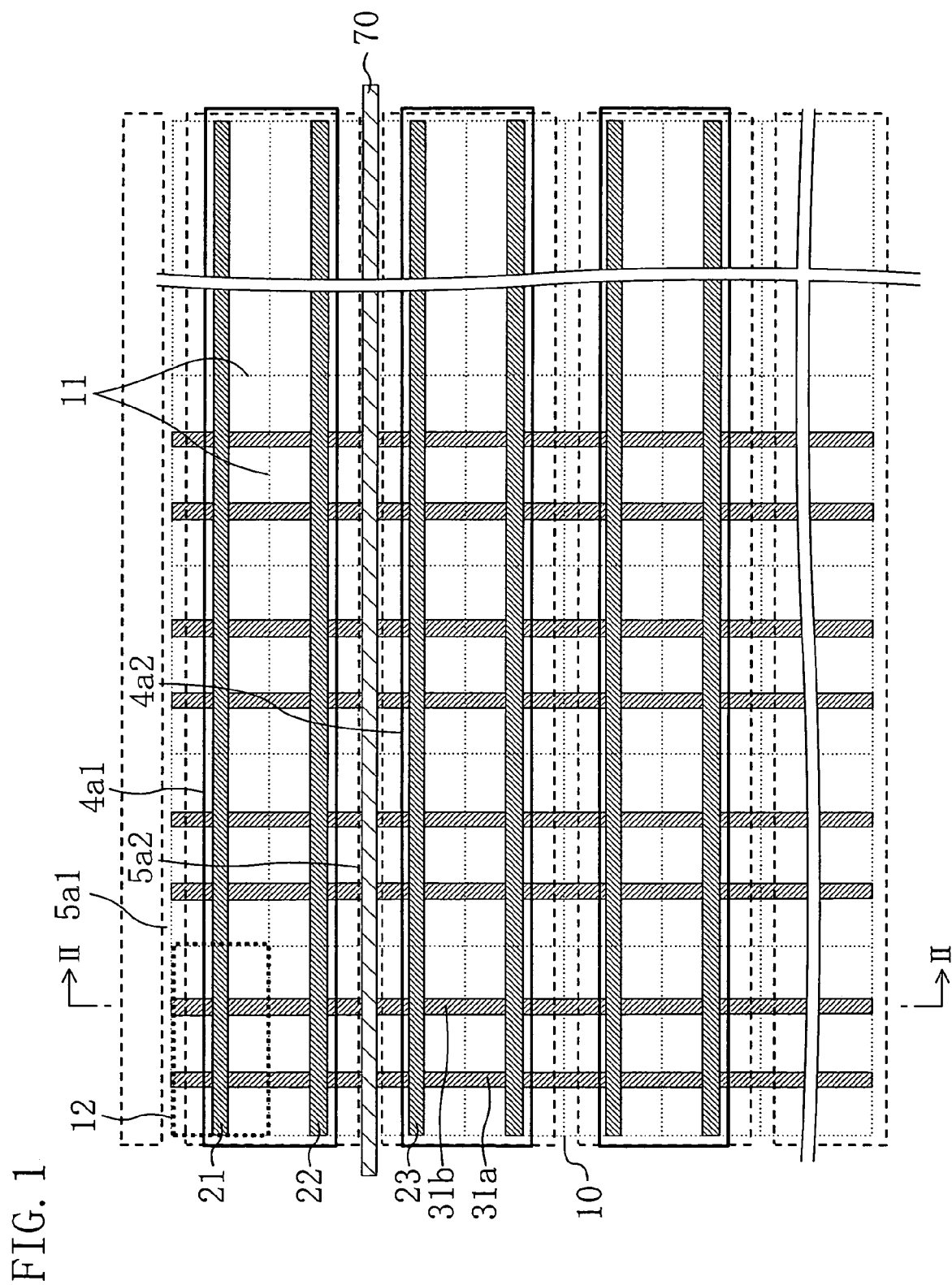
FIG. 1 is a plan view of a memory cell array portion in a semiconductor device according to embodiment 1 of the present invention.

FIG. 1 shows a layout of a memory cell array portion of a semiconductor device according to embodiment 1 of the present invention. In FIG. 1, reference numeral 10 denotes an entire memory cell array region, which includes a repetition pattern of memory cell units 12 partitioned by cell boundaries 11. Word lines (21, 22, 23, . . . ) run horizontally through the memory cells 12. Complementary bit line pairs (31a, 31b, . . . ) are formed in a wire layer at a lower level than the word lines (21, 22, 23, . . . ) so as to run vertically through the memory cells 12. Over the memory cell array having such a structure, dummy wire patterns (4a1, 4a2, . . . ) are formed such that each dummy wire pattern covers two word lines (for example, the dummy wire pattern 4a1 covers two word lines 21 and 22). Between the dummy wire patterns (4a1, 4a2, . . . ), wire channels (5a1, 5a2, . . . ) of the same metal layer are provided at every other central position between the word lines (21, 22, 23, . . . ).

Automatic wiring over the memory cell array 10 having such a structure is carried out while any of the wire channels (5a1, 5a2, . . . ) is selected so as to avoid the dummy wire patterns (4a1, 4a2, . . . ). In the embodiment shown in FIG. 1, a signal line 70 is formed using the wire channel 5a2 in an upper layer between the word lines 22 and 23. In the absence of the dummy wire patterns (4a1, 4a2, . . . ), the automatic wiring has a possibility that the signal line 70 runs immediately above the word lines 21 and 22. On the other hand, in a static RAM according to the present invention, the signal line 70 is surely provided at a central position between the word lines. Therefore, the coupling capacitance between the word lines 22 and 23 and the signal line 70 can be reduced.

Figure 2:
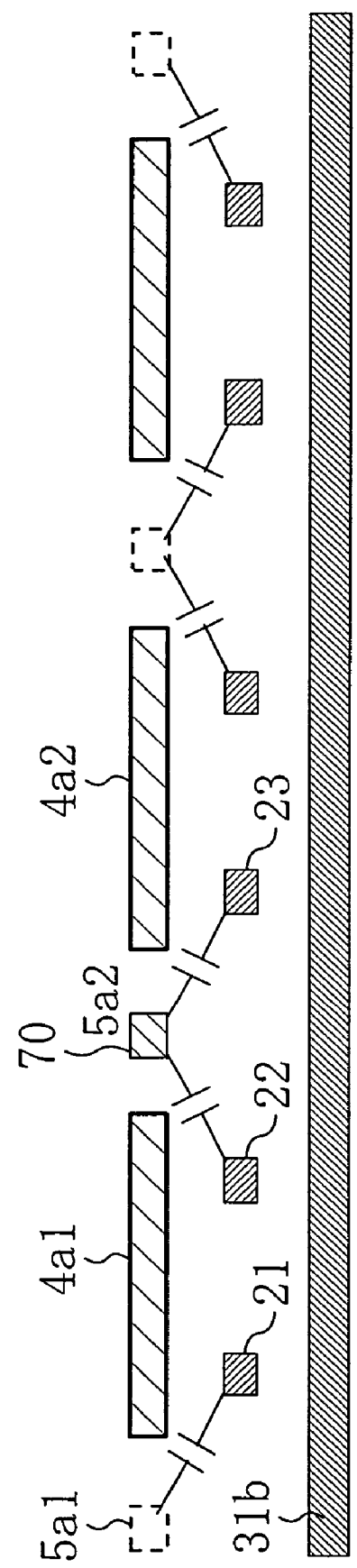
FIG. 2 is a cross-sectional view of the memory cell array portion taken along line II-II of FIG. 1.

FIG. 2 is a cross-sectional view of the memory cell array portion taken along line II-II of FIG. 1. Between the word lines (21, 22, 23, . . . ) which cross the bit line 31b at right angles and the wire channels (5a1, 5a2, . . . ) which run alongside the word lines (21, 22, 23, . . . ), coupling capacitance is generated in diagonal directions as shown in FIG. 2. The signal line 70 and the word lines 22 and 23 have coupling capacitance therebetween in diagonal directions. Since the coupling capacitance is generally inversely proportional to the distance between lines, the diagonal coupling capacitance is considerably small as compared with a structure where the signal line runs immediately above the word lines.

According to this embodiment, each of the dummy wire patterns (4a1, 4a2, . . . ) covers two word lines. Therefore, even when a signal line is provided in the wire channel 5a1 which is adjacent to the word line 21, no line runs between the word lines 21 and 22. Thus, the interval between signal lines is large. As a result, a problem of large crosstalk between the signal line 70 and signal lines in the same layer, which would be caused by a simultaneous signal change, can be avoided.

Figure 3:
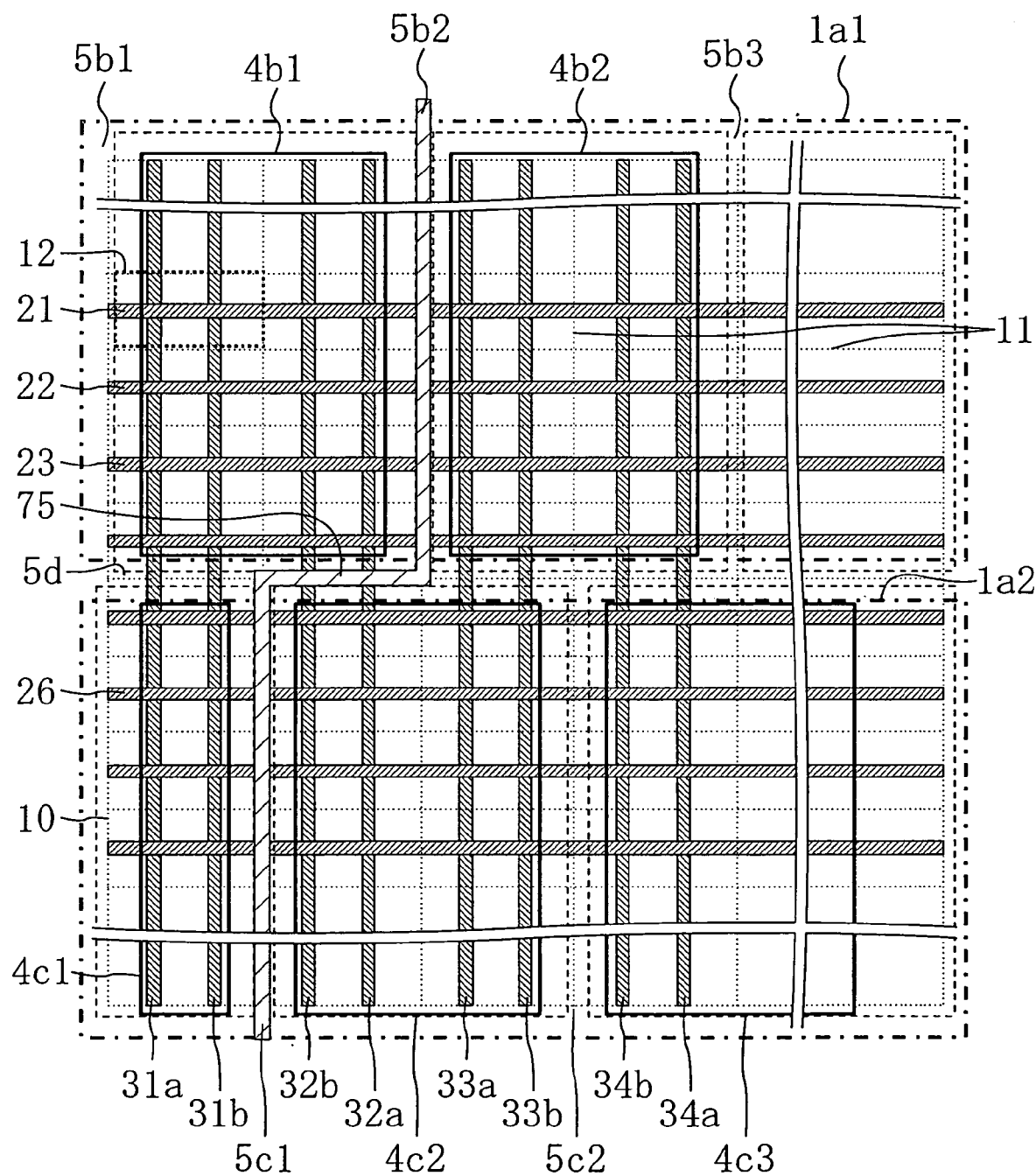
FIG. 3 is a plan view of a memory cell array portion in a semiconductor device according to embodiment 2 of the present invention.

FIG. 3 shows a layout of a memory cell array portion in a semiconductor device according to embodiment 2 of the present invention. In FIG. 3, a memory cell array 10 is divided into two sub-array regions 1a1 and 1a2. In each of the sub-array regions 1a1 and 1a2, dummy wire patterns are provided in a wire layer lying over the word lines (21, 22, 23, . . . ) such that each dummy wire pattern covers four of the bit lines (31a, 31b, 32b, 32a, 33a, 33b, 34b, 34a, . . . ). Herein, dummy wire patterns 4b1, 4b2, . . . are included in the sub-array region 1a1, and dummy wire patterns 4c1, 4c2, 4c3, . . . are included in the sub-array region 1a2. It should be noted, however, that the dummy wire pattern 4c1 of the sub-array region 1a2 is formed to cover only two bit lines, the bit lines 31a and 31b. Accordingly, wire channels (5c, 5c2, . . . ) provided between the dummy wire patterns in the sub-array region 1a2 are shifted horizontally by two bit lines from wire channels (5b1, 5b2, 5b3, . . . ) provided between the dummy wire patterns in the sub-array region 1a1. Further, an array boundary wire channel 5d is provided at the boundary between the sub-array regions 1a1 and 1a2. In the embodiment shown in FIG. 3 with such a layout structure, a signal line 75 is provided using the wire channels 5b2, 5d and 5c1.

In the layout of this embodiment, when viewed from each bit line, a wire channel is provided only on one side of one of the two regions. For example, the bit line 32b has the wire channel 5c1 only on one side of the sub-array region 1a2. As well, the bit line 32a has the wire channel 5b2 only on one side of the sub-array region 1a1. The signal line 75 provided using these wire channels and the bit lines 31b and 32b generate coupling capacitance therebetween only in the sub-array region 1a2. In the other sub-array region 1a1, the signal line 75 and the bit lines 32a and 33a generate coupling capacitance therebetween. Thus, according to this embodiment, when viewed from a bit line, a signal line in an upper layer is provided only on one side of a half region of the memory cell array. Therefore, the influence of the signal line on the bit line is effectively reduced.

In general, the memory cell array region is equally divided into N sub-regions (N is an integer equal to or greater than 2), and dummy wire patterns are formed to cover 2N bit lines with a shift by 2 bit lines for each sub-region. With such an arrangement, the wire channels running between the dummy wire patterns are at positions shifted by two bit lines for each sub-region. When viewed from one bit line, the length of a wire channel running alongside the bit line is a 1/N of the length of the bit line. As a result, the coupling capacitance is reduced to 1/N.

A semiconductor device according to embodiment 3 of the present invention is described with reference to FIG. 4, FIG. 5 and FIG. 6. The semiconductor device of embodiment 3 has a region in which two layers of signal lines can be placed on a memory block.

Figure 4:
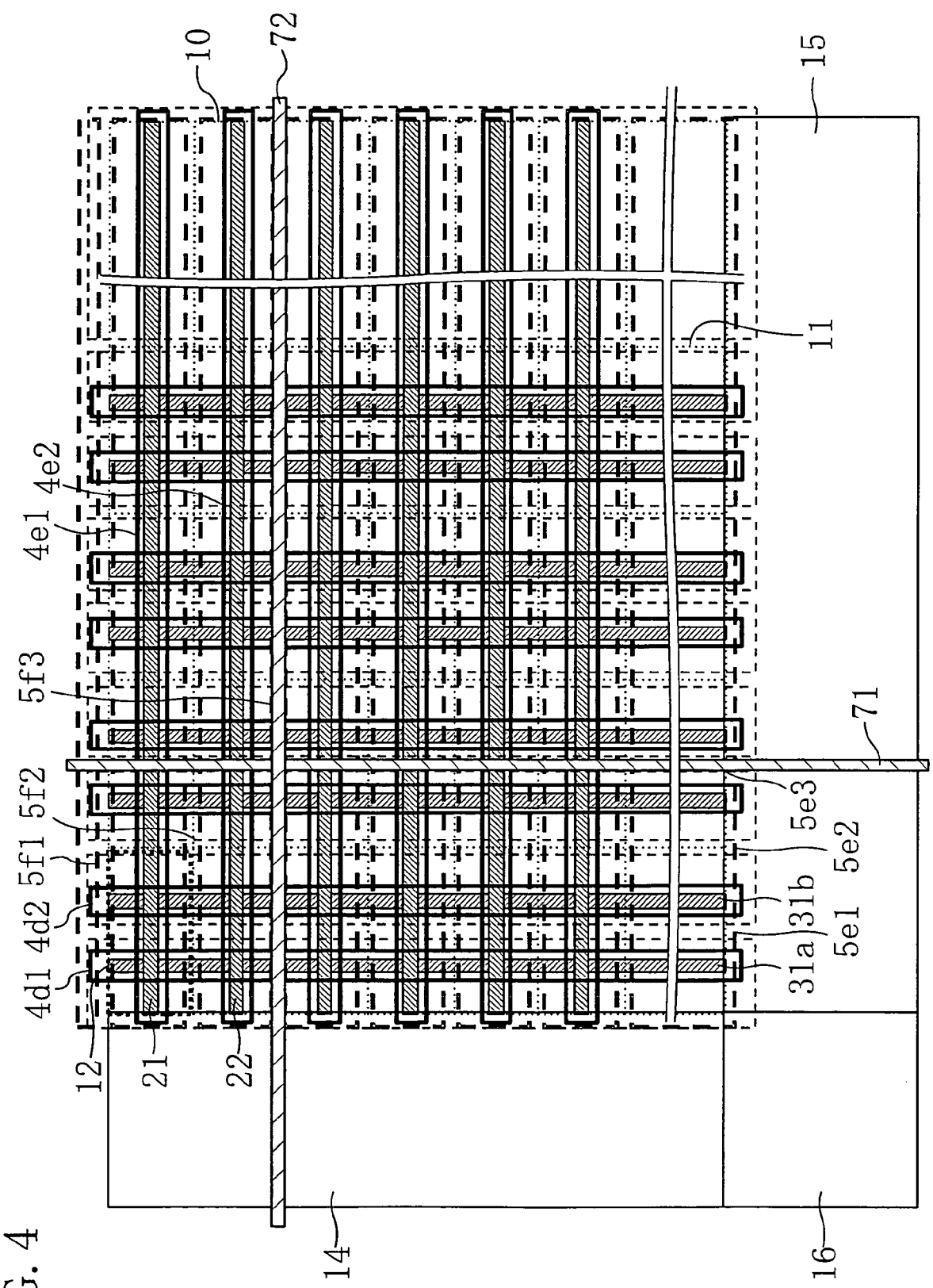
FIG. 4 is a plan view of a type-1 memory cell array portion in a semiconductor device according to embodiment 3 of the present invention.

FIG. 4 shows a layout of a type-1 memory cell array portion in the semiconductor device according to embodiment 3 of the present invention. In FIG. 4, reference numeral 14 denotes a row decoder which includes word line drivers, reference numeral 15 denotes a data input/output section which includes sense amplifiers, and reference numeral 16 denotes a control circuit. In the block of FIG. 4, in a layer lying on a wire layer which includes word lines (21, 22, . . . ) over the memory cell array region 10, dummy wire patterns (4d1, 4d2, . . . ) are formed so as to cover every one of bit lines (31a, 31b, . . . ). Between the dummy wire patterns (4d1, 4d2, . . . ) are wire channels (5e1, 5e2, 5e3, . . . ). In another overlying layer lying on the first dummy wire pattern layer, dummy wire patterns (4e1, 4e2, . . . ) are formed so as to cover every one of the word lines (21, 22, . . . ). Between the dummy wire patterns (4e1, 4e2, . . . ) are wire channels (5f1, 5f2, 5f3, . . . ). Since the bit lines (31a, 31b, . . . ) cross the word lines (21, 22, . . . ) at right angles, the lower-layer wire channels (5e1, 5e2, 5e3, . . . ) also cross the upper-layer wire channels (5f1, 5f2, 5f3, . . . ) at right angles. In this type-1 memory cell array portion, a vertically-running signal line 71 is provided using the wire channel 5e3 in the layer lying on the wire layer including the word lines. In another overlying layer lying on the layer including the signal line 71, a horizontally-running signal line 72 is provided using the wire channel 5f3.

Figure 5:
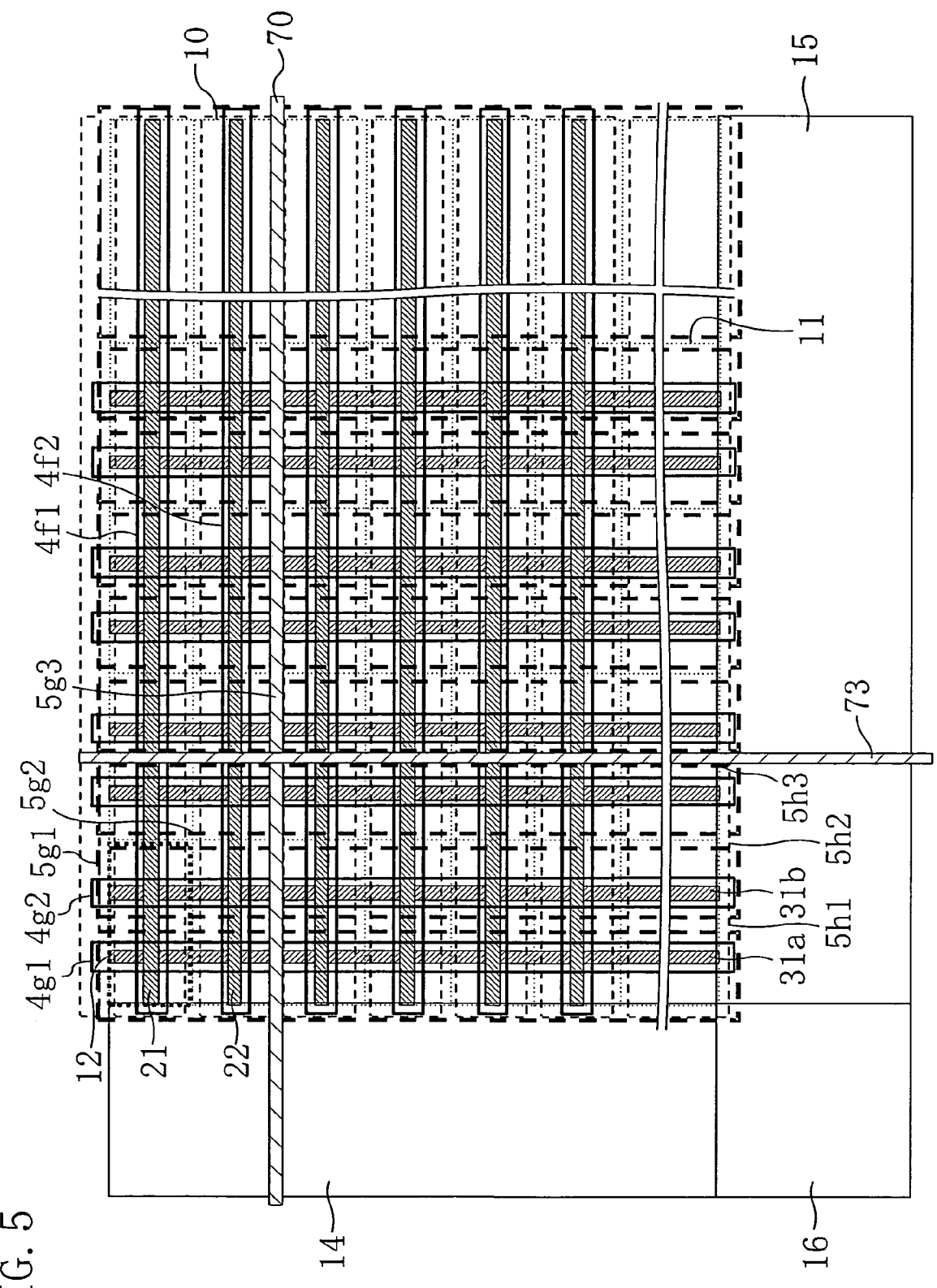
FIG. 5 is a plan view of a type-2 memory cell array portion in a semiconductor device according to embodiment 3 of the present invention.

FIG. 5 shows a layout of a type-2 memory cell array portion in the semiconductor device according to embodiment 3 of the present invention. In FIG. 5, dummy wire patterns (4f1, 4f2, . . . ) are formed over the memory cell array region 10 so as to cover every one of word lines (21, 22, . . . ). Between the dummy wire patterns (4f1, 4f2, . . . ) are wire channels (5g1, 5g2, 5g3, . . . ). In another overlying layer lying on the first dummy wire pattern layer, dummy wire patterns (4g1, 4g2, . . . ) are formed so as to cover every one of the bit lines (31a, 31b, . . . ). Between the dummy wire patterns (4g1, 4g2, . . . ) are wire channels (5h1, 5h2, 5h3, . . . ). Also in the type-2 memory cell array portion, the lower-layer wire channels (5g1, 5g2, 5g3, . . . ) cross the upper-layer wire channels (5h1, 5h2, 5h3, . . . ) at right angles. In the shown example, a horizontally-running signal line 70 is provided using the wire channel 5g3 in the layer lying on the wire layer including word lines. In another overlying layer lying on the layer including the signal line 70, a vertically-running signal line 73 is provided using the wire channel 5h3.

Figure 6:
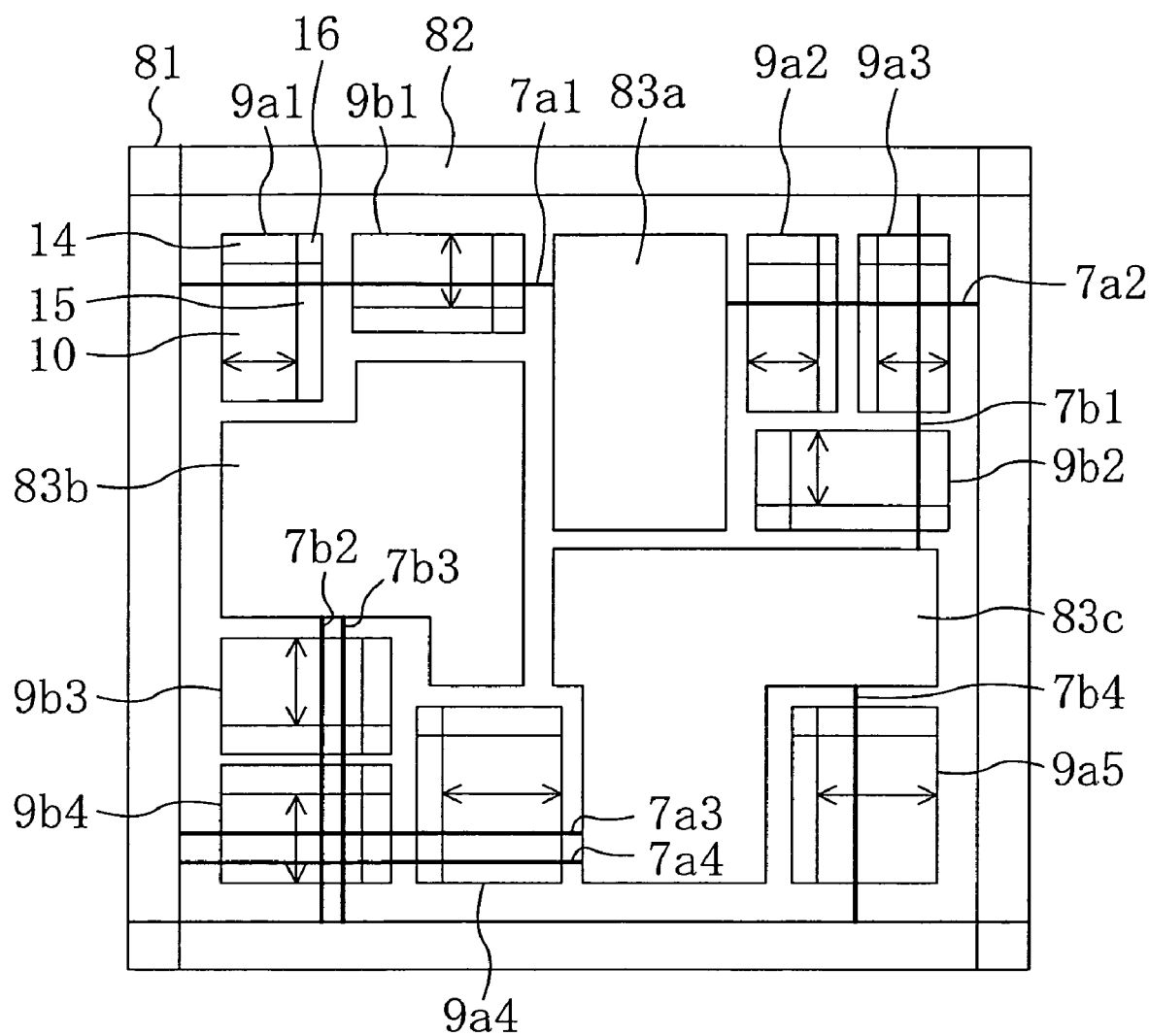
FIG. 6 is a plan view of a semiconductor device according to embodiment 3 of the present invention.

FIG. 6 shows a layout of the semiconductor device according to embodiment 3 of the present invention. The semiconductor device of FIG. 6 has an IO cell placement region 82 at the periphery of a semiconductor integrated circuit chip 81. The inside of the IO cell placement region 82 includes logic circuit regions 83a, 83b and 83c, type-1 static RAM blocks 9a1, 9a2, 9a3, 9a4 and 9a5, and type-2 static RAM blocks 9b1, 9b2, 9b3 and 9b4. An arrow shown in the memory cell array region 10 of each static RAM block indicates the direction in which bit lines run. Over the chip 81, the type-1 block is used for a block including horizontally-running bit lines which is placed with a rotation of 90° or 270°, and the type-2 block is used for a block including vertically-running bit lines which is placed with a rotation of 0° or 180°.

In the type-1 block, a lower-layer wire channel runs in the direction of the bit lines. That is, the type-1 block has the wire channel in the horizontal direction when viewed from the chip 81. Meanwhile, in the type-2 block, a lower-layer wire channel runs in the direction of the word lines which crosses the bit lines at right angles. That is, the type-2 block also has the wire channel in the horizontal direction when viewed from the chip 81. In a layer lying on the lower layer, the type-1 block has a wire channel running in the direction of the word lines, i.e., has a wire channel running vertically when viewed from the chip 81, and the type-2 block has a wire channel running in the direction of the bit lines, i.e., has a wire channel running vertically as well when viewed from the chip 81. Thus, over the chip 81 shown in FIG. 6, all the lower-layer wire channels on each static RAM block run horizontally, while all the upper-layer wire channels run vertically. In the chip 81 of this embodiment, these wire channels are used to provide lower layer signal lines 7a1, 7a2, 7a3 and 7a4, which run horizontally in a layer lying on the wire layer including the word lines, and upper layer signal lines 7b1, 7b2, 7b3 and 7b4, which run vertically over the lower layer signal lines.

In general, in an automatic arrangement and wiring process over a semiconductor chip, it is desirable that the line direction of each wire layer is unified in the entire chip such that change of wire layers does not occur. The static RAM block arrangement method of this embodiment matches such requirements in the wire arrangement over the entire chip. For example, when signal lines are provided between logic circuits or between a logic circuit and an IO cell using wire channels on a static RAM block, an area loss which would be caused by a change of wire layers does not occur, and accordingly, a smooth automatic wiring process is achieved.

Figure 7:
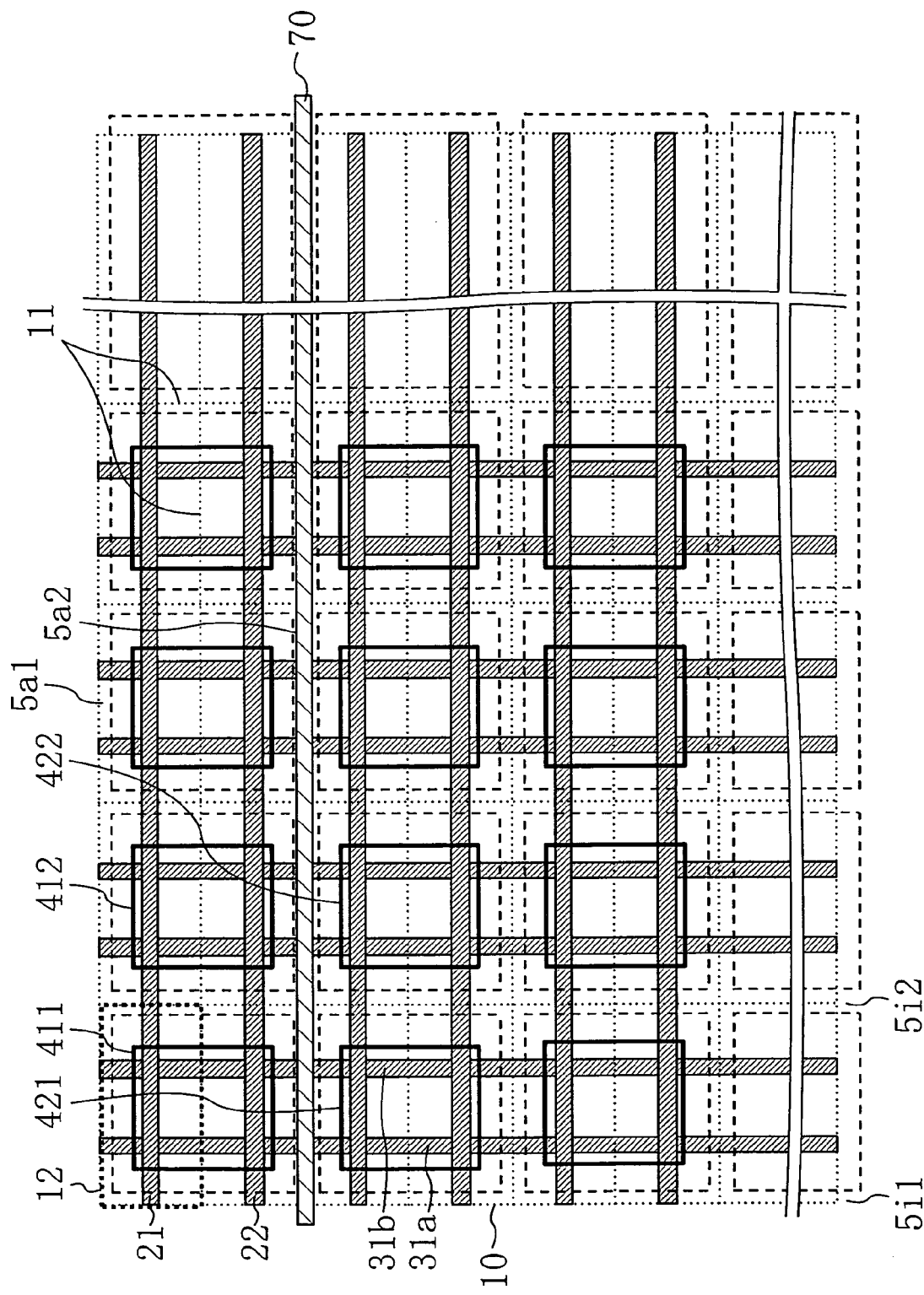
FIG. 7 is a plan view of a memory cell array portion in a semiconductor device according to embodiment 4 of the present invention.

FIG. 7 shows a layout of a memory cell array portion in a semiconductor device according to embodiment 4 of the present invention. In FIG. 7, over a memory cell array region 10, dummy wire patterns (411, 412, . . . and 421, 422 . . . ) are formed in a layer lying on a wire layer including word lines such that each dummy wire pattern covers 2×2 horizontally and vertically-adjacent intersection points of the word lines and bit lines (for example, the dummy wire pattern 411 covers four intersection points of two word lines 21 and 22 and two bit lines 31a and 31b). Between the dummy wire patterns (411, 412, . . . and 421, 422 . . . ) are horizontally-running wire channels (5a1, 5a2, . . . ) and vertically-running wire channels (5i1, 5i2, . . . ) which are arranged in a lattice pattern in the same metal wire layer.

Automatic wiring over the memory cell array region 10 having such a structure is carried out while any of the wire channels (5a1, 5a2, . . . and 5i1, 5i2, . . . ) is selected so as to avoid the dummy wire patterns (411, 412, . . . and 421, 422 . . . ). In the embodiment shown in FIG. 7, a signal line 70 is formed using the wire channel 5a2 in a layer lying on the wire layer of the word lines. In the absence of the dummy wire patterns (411, 412, . . . and 421, 422 . . . ), the automatic wiring has a possibility that a signal line is provided to run immediately above the word lines (21, 22, . . . ) or the bit lines (31a, 31b, . . . ). On the other hand, in a static RAM according to the present invention, the signal line in the upper layer is surely provided at central positions of the word lines and bit lines. Therefore, the coupling capacitance can be reduced. Further, according to this embodiment, each of the dummy wire patterns (411, 412, . . . and 421, 422 . . . ) covers two succeeding intersection points of the word lines and bit lines. Thus, when viewed from each word line or bit line, a wire channel is provided only on one side. As a result, a problem of large crosstalk, which would be caused by simultaneous signal changes in a plurality of upper layer lines, can be avoided.

This embodiment is different from the aforementioned embodiments in that vertically-running wire channels and horizontally-running wire channels are provided in the same wire layer. Therefore, in the case where the static RAM of this embodiment is provided on a semiconductor chip, an optimum block arrangement is achieved over the chip without depending on the line direction determined for each wire layer in an automatic wiring process. As a result, occurrence of a dead space over the chip which would be caused by block arrangement restrictions, an area loss caused by a change of wire layers which would result from inconsistency between the line direction on the chip and the wire channel direction on a static RAM when priority is given to block arrangement, etc., can be prevented.

Figure 8:
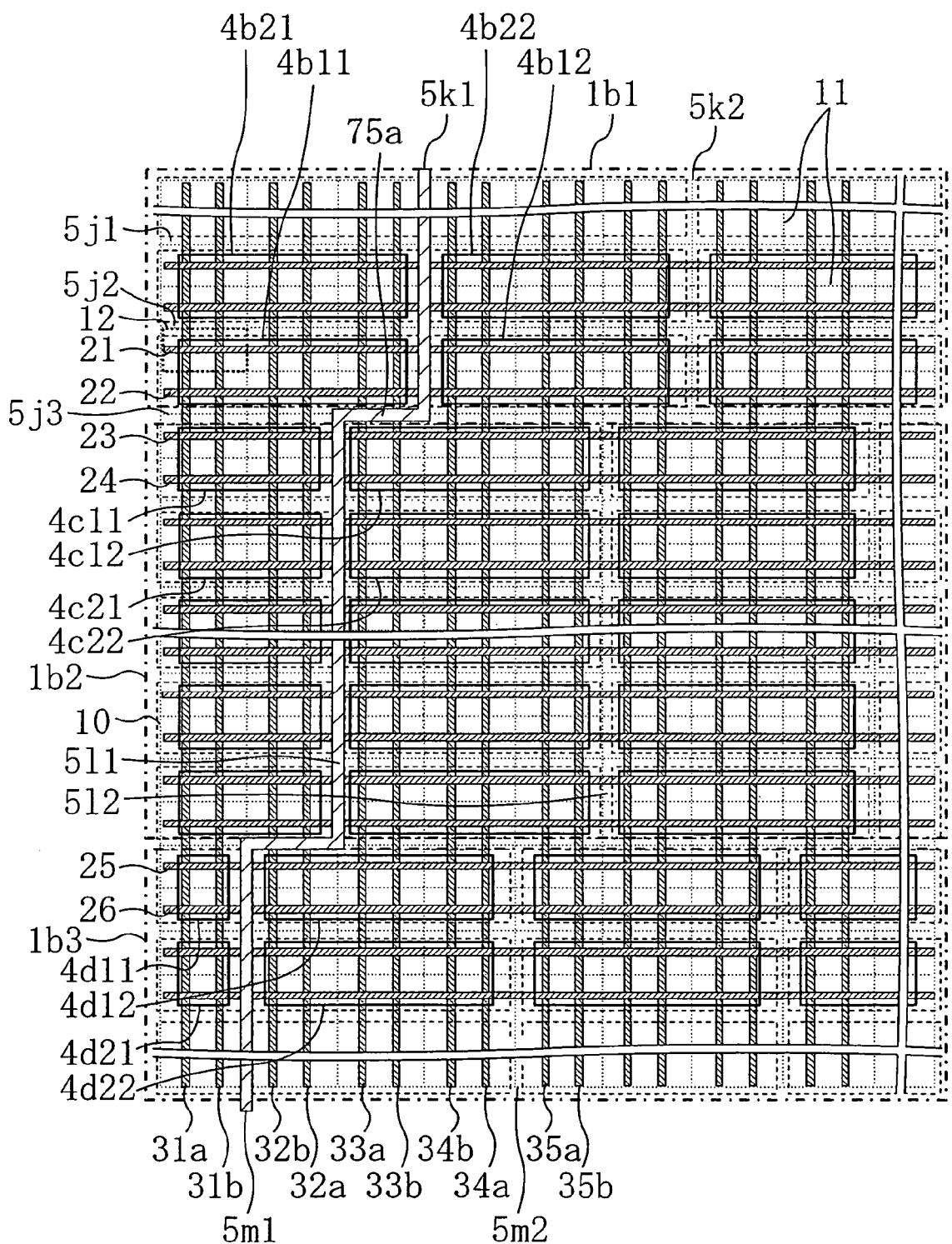
FIG. 8 is a plan view of a memory cell array portion in a semiconductor device according to embodiment 5 of the present invention.

FIG. 8 shows a layout of a memory cell array portion in a semiconductor device according to embodiment 5 of the present invention. In FIG. 8, a memory cell array region 10 is divided into three sub-array regions 1b1, 1b2 and 1b3. In each of the sub-array regions 1b1, 1b2 and 1b3, dummy wire patterns (4b11, 4b12, 4b21, 4b22 . . . , 4c11, 4c12, 4c21, 4c22 . . . , and 4d11, 4d12, 4d21, 4d22 . . . ) are provided such that each dummy wire pattern covers intersection points of two word lines and six bit lines, i.e., 12 intersection points in total. It should be noted, however, that the dummy wire patterns (4c11, 4c21, . . . ) provided along the left side of the sub-array region 1b2 are formed to cover only four bit lines, and the dummy wire patterns (4d11, 4d21, . . . ) provided along the left side of the sub-array region 1b3 are formed to cover only two bit lines. Accordingly, wire channels (5k1, 5k2, . . . ) running vertically between the dummy wire patterns in the sub-array region 1b1, wire channels (5l1, 5l2, . . . ) running vertically between the dummy wire patterns in the sub-array region 1b2, and wire channels (5m1, 5m2, . . . ) running vertically between the dummy wire patterns in the sub-array region 1b3 are horizontally shifted from each other by two bit lines. Further, horizontally-running wire channels (5j1, 5j2, 5j3, . . . ) are provided between the dummy wire patterns. In the embodiment shown in FIG. 8, among the above wire channels, the wire channels 5m2, 5l1 and 5k1 are used to provide a signal line 75a.

With the above layout structure, when viewed from each bit line, the wire channels are formed only at one side of only one of three divisional regions. For example, the bit line 32b has the wire channel 5m1 only at one side of the region 1b3. As well, the bit line 32a has the wire channel 5l1 only at one side of the region 1b2. A ⅓ of the signal line 75a provided using the above wire channels and the bit lines 31b and 32b form a coupling capacitance. Another ⅓ of the signal line 75a and the bit lines 32a and 33a form a capacitance. The remaining ⅓ of the signal line 75a and the bit lines 33b and 34b form a capacitance. Thus, according to this embodiment, a signal line extending in a layer lying over the bit lines is provided only in a ⅓ of the memory cell array on one side while vertically-running wire channels and horizontally-running wire channels are provided in the same wire layer. Therefore, the influence of the signal line on the bit lines is effectively reduced as compared with a structure where the wire channels run alongside the bit lines over the memory cell array.

Figure 9:
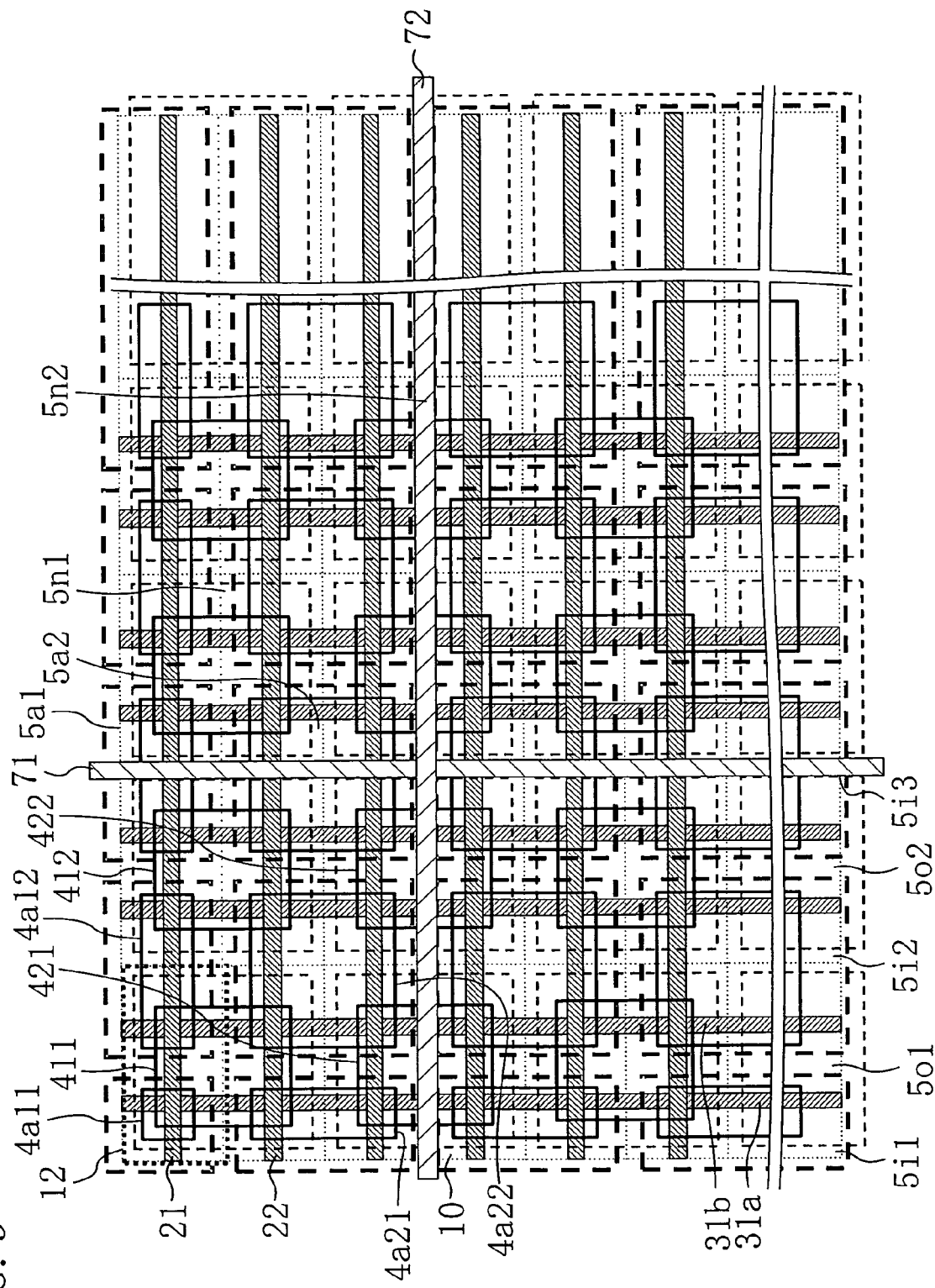
FIG. 9 is a plan view of a memory cell array portion in a semiconductor device according to embodiment 6 of the present invention.

FIG. 9 shows a layout of a memory cell array portion in a semiconductor device according to embodiment 6 of the present invention. In FIG. 9, over a memory cell array region 10, dummy wire patterns (411, 412, . . . and 421, 422 . . . ) are formed in a layer lying on a wire layer including word lines such that each dummy wire pattern covers 2×2 horizontally and vertically-adjacent intersection points of the word lines and the bit lines as are in FIG. 7. Between the dummy wire patterns (411, 412, . . . and 421, 422 . . . ) are horizontally-running wire channels (5a1, 5a2, . . . ) and vertically-running wire channels (5i1, 5i2, 5i3, . . . ) which are arranged in a lattice pattern in the same metal wire layer. In this embodiment, dummy wire patterns (4a11, 4a12, . . . and 4a21, 4a22 . . . ) are further provided in a layer lying on the first dummy wire pattern layer such that each dummy wire pattern covers 2×2 horizontally and vertically-adjacent intersection points of the word lines and the bit lines. Between the superposed dummy wire patterns (4a11, 4a12, . . . and 4a21, 4a22 . . . ) are horizontally-running wire channels (5n1, 5n2, . . . ) and vertically-running wire channels (5o1, 5o2, . . . ) which are arranged in a lattice pattern in the same metal wire layer. It should be noted, however, that each of the dummy wire patterns (4a11, 4a12, . . . ) provided at the uppermost row of the memory cell array shown in FIG. 9 covers only intersection points of one word line, each of the dummy wire patterns (4a11, 4a21, . . . ) provided at the left end side of the memory cell array covers only intersection points of one bit line. Thus, the positions of the upper-layer wire channels (5n1, 5n2, . . . and 5o1, 5o2 . . . ) are shifted from the positions of the lower-layer wire channels (5a1, 5a2, . . . and 5i1, 5i2 . . . ) and provided at the central positions of the lower-layer wire channels (5a1, 5a2, . . . and 5i1, 5i2 . . . ).

Automatic wiring over the memory cell array region 10 having such a structure is carried out while any of the lower-layer wire channels (5a1, 5a2, . . . and 5i1, 5i2, 5i3, . . . ) is selected so as to avoid the lower-layer dummy wire patterns (411, 412, . . . and 421, 422, . . . ), and any of the upper-layer wire channels (5n1, 5n2, . . . and 5o1, 5o2, . . . ) is selected so as to avoid the upper-layer dummy wire patterns (4a11, 4a12, . . . and 4a21, 4a22 . . . ). In the embodiment shown in FIG. 9, a signal line 71 is formed using the wire channel 5i3 in a layer lying on the wire layer of the word lines, and in a layer lying on the layer of the signal line 71, a signal line 72 is formed using the wire channel 5n2.

According to this embodiment, the crosstalk between the word and bit lines and the signal lines in the overlying layers can be reduced as in embodiment 4. Further, vertically-running wire channels and horizontally-running wire channels are provided in the same wire layer. Thus, in an automatic wiring process over a chip, an optimum block arrangement is achieved without depending on the line direction determined for each wire layer. Furthermore, since the positions of wire channels in the upper layer and the lower layer are shifted from each other, the lower-layer dummy wire patterns function as shields for the word and bit lines. Accordingly, the influence of the upper layer signal lines can be reduced to an almost negligible level. Further, the positions of the signal channels are shifted between the upper layer and the lower layer, and accordingly, crosstalk between the signal lines can be avoided. Therefore, the operation reliability of peripheral logic circuits provided around a memory can be improved.

Figure 10:
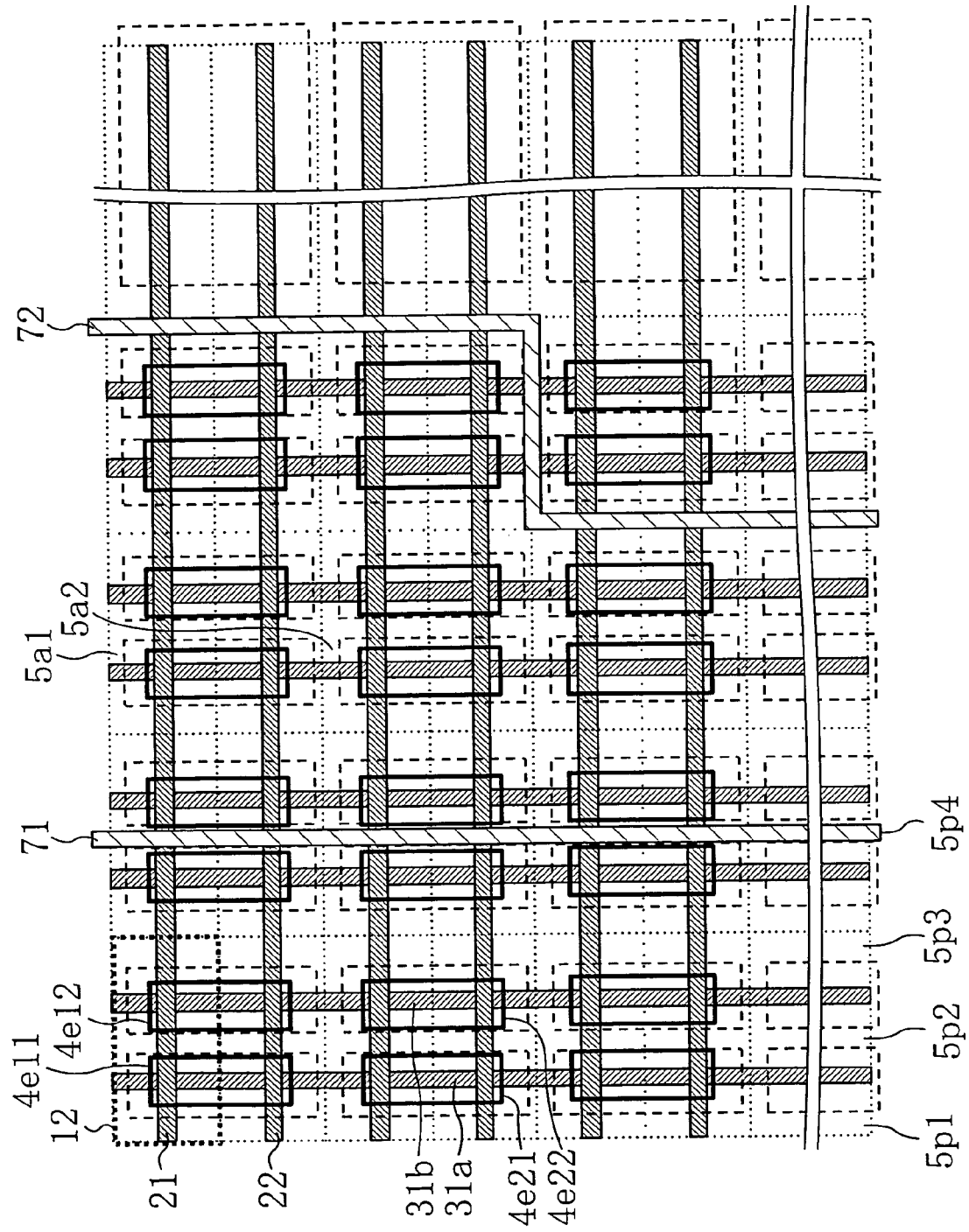
FIG. 10 is a plan view of a memory cell array portion in a semiconductor device according to embodiment 7 of the present invention.

FIG. 10 shows a layout of a memory cell array portion in a semiconductor device according to embodiment 7 of the present invention. In FIG. 10, over a memory cell array, dummy wire patterns (4e11, 4e12, . . . and 4e21, 4e22 . . . ) are formed in a layer lying on a wire layer including word lines such that each dummy wire pattern covers 2×2 horizontally and vertically-adjacent intersection points of the word lines and the bit lines. Between the dummy wire patterns (4e11, 4e12, . . . and 4e21, 4e22 . . . ) are horizontally-running wire channels (5a1, 5a2, . . . ) and vertically-running wire channels (5p1, 5p2, 5p3, 5p4, . . . ) which are provided in the same metal wire layer. Every other one of the vertically-running wire channels has a different channel width. The interval between complementary bit line pair 31a and 31b is short, and therefore, a wire channel between the bit lines 31a and 31b has a narrow width, whereas the wire channels (5p1, 5p3, . . . ) between the bit line pairs are wide according to the interval between the bit line pairs.

With the thus-arranged wire channels, signal lines on a static RAM of this embodiment are as shown in FIG. 10. For example, a signal line 71 is formed using a wire channel between complementary bit lines. In this case, no signal line is provided in adjacent wire channels at the sides of the wire channel of the signal line 71. Normally, in a static RAM, a very small voltage amplitude of a complementary bit line pair is amplified by a sense amplifier to read memory cell data. In this process, there is a possibility that crosstalk caused by lines in an upper layer lying on the complementary bit line pair causes a variation in the bit line potential so that a sufficient voltage amplitude cannot be achieved, resulting in a malfunction. However, in the signal line 71 of this embodiment, the coupling capacitance is equal with respect to the complementary bit line pair. Even if crosstalk occurs, the potential difference between the bit lines is maintained, whereby occurrence of a malfunction is suppressed.

FIG. 10 further shows a signal line 72 which is provided using two wire channels at the sides of a complementary bit line pair in the same length. In this example, when viewed form one of the bit lines, the length of a signal line running alongside is a ½ of the bit line. Further, since the wire channels are wide, the signal line can be provided at a position more distant from the complementary bit line pair. As a result, the influence of crosstalk is decreased. It should be noted however that, in this example, the signal line is desirably provided to run in the wire channel at a side closer to the complementary bit line in order to prevent generation of the coupling capacitance with a bit line at the other side of the wire channel. Furthermore, in order to avoid the influence of other signal lines, it is necessary not to provide a signal line in the wire channel between the complementary bit line pair or adjacent wire channels at both sides.

The present invention is not limited to an example where word lines are provided over bit lines as in the above embodiments but is applicable to an example where bit lines are provided over word lines.

In the above-described embodiments, dummy wire patterns are used to form wire channels. Instead, however, wiring-prohibited regions distinguishable by an automatic wiring tool may be set such that the area between the wiring-prohibited regions is used as a wire channel. Specifically, wiring-prohibited regions are provided in an automatic wiring process, and an area outside the wiring-prohibited regions is used as wire channels.

Since there is no potential change in power supply lines over a chip, the possibility of a malfunction is low even when the power supply lines are provided immediately above word lines or bit lines. Thus, a wiring method may be employed wherein power supply lines are provided over a chip before signal lines are routed, and the area other than wiring-prohibited regions determined by the positions of word lines and bit lines and power supply line regions on the chip is used for wire channels.

As described hereinabove, a semiconductor device of the present invention is useful as a system LSI incorporating a static RAM, or the like, because the influence of crosstalk between memory lines and signal lines extending over a memory cell array is reduced, and wiring position control is possible in an automatic wiring process.

What is claimed is:

1. A semiconductor device, comprising:
a memory cell array including a plurality of memory lines, the memory lines including a plurality of word lines or a plurality of bit lines, the bit lines crossing the word lines at right angles;
a plurality of dummy wire patterns formed on the memory cell array to cover at least part of the memory lines; and
a signal line extending over the memory cell array through a wire channel formed between the dummy wire patterns, wherein:
the memory cell array is divided into a plurality of sub-arrays by boundaries which are perpendicular to the extending directions of the memory lines;
a wire channel in each of the sub-arrays is shifted from a wire channel in an adjacent sub-array in the directions of the boundaries;
an array boundary wire channel is provided along the boundaries between the adjacent sub-arrays; and
the signal line extends through a wire channel in each of the sub-arrays and the array boundary wire channel.

2. A semiconductor device, comprising:
a memory cell array including a plurality of memory lines, the memory lines including a plurality of word lines or a plurality of bit lines, the bit lines crossing the word lines at right angles;
a plurality of dummy wire patterns formed on the memory cell array to cover at least part of the memory lines; and
a signal line extending over the memory cell array through a wire channel formed between the dummy wire patterns, wherein:
the plurality of dummy wire patterns have a two-layer structure including a plurality of lower-layer dummy wire patterns and a plurality of upper-layer dummy wire patterns;
the plurality of lower-layer dummy wire patterns are provided such that each lower-layer dummy wire pattern covers at least one of the bit lines, and a wire channel is formed between the lower-layer dummy wire patterns so as to extend in the direction of the bit lines; and
the plurality of upper-layer dummy wire patterns are provided such that each upper-layer dummy wire pattern covers at least one of the word lines, and a wire channel is formed between the upper-layer dummy wire patterns so as to extend in the direction of the word lines.

3. A semiconductor device, comprising:
a memory cell array including a plurality of memory lines, the memory lines including a plurality of word lines or a plurality of bit lines, the bit lines crossing the word lines at right angles;
a plurality of dummy wire patterns formed on the memory cell array to cover at least part of the memory lines; and
a signal line extending over the memory cell array through a wire channel formed between the dummy wire patterns, wherein:
the plurality of dummy wire patterns have a two-layer structure including a plurality of lower-layer dummy wire patterns and a plurality of upper-layer dummy wire patterns;
the plurality of lower-layer dummy wire patterns are provided such that each lower-layer dummy wire pattern covers at least one of the word lines, and a wire channel is formed between the lower-layer dummy wire patterns so as to extend in the direction of the word lines; and
the plurality of upper-layer dummy wire patterns are provided such that each upper-layer dummy wire pattern covers at least one of the bit lines, and a wire channel is formed between the upper-layer dummy wire patterns so as to extend in the direction of the bit lines.

4. A semiconductor device, comprising:
a memory cell array including a plurality of memory lines, the memory lines including a plurality of word lines or a plurality of bit lines, the bit lines crossing the word lines at right angles;
a plurality of dummy wire patterns formed on the memory cell array to cover at least part of the memory lines; and
a signal line extending over the memory cell array through a wire channel formed between the dummy wire patterns, wherein:
first and second memory cell arrays are provided on the same chip, each of the first and second memory cell arrays including a plurality of word lines and a plurality of bit lines, the bit lines crossing the word lines at right angles;
a series of lower-layer wire channels are formed between a plurality of lower-layer dummy wire patterns, the lower-layer wire channels extending in the bit line direction on the first memory cell array, the lower-layer wire channels extending in the word line direction on the second memory cell array;

a series of upper-layer wire channels are formed between a plurality of upper-layer dummy wire patterns, the upper-layer wire channels on the first memory cell array extending in the word line direction, the upper-layer wire channels on the second memory cell array extending in the word line direction; and the signal line extends over the first and second memory cell arrays through the lower-layer wire channels or the upper-layer wire channels.

5. A semiconductor device, comprising:

a memory cell array including a plurality of memory lines, the memory lines including a plurality of word lines or a plurality of bit lines, the bit lines crossing the word lines at right angles;

a plurality of dummy wire patterns formed on the memory cell array to cover at least part of the memory lines; and a signal line extending over the memory cell array through a wire channel formed between the dummy wire patterns, wherein:

the plurality of dummy wire patterns have a two-layer structure including a plurality of lower-layer dummy wire patterns and a plurality of upper-layer dummy wire patterns;

the plurality of lower-layer dummy wire patterns are provided such that each lower-layer dummy wire pattern covers four or more of a plurality of intersection points of the word lines and the bit lines, and a wire channel is formed between the lower-layer dummy wire patterns to have a lattice shape; and the plurality of upper-layer dummy wire patterns are provided such that each upper-layer dummy wire pattern covers four or more of a plurality of intersection points of the word lines and the bit lines in a combination different from that of the lower-layer dummy wire patterns, and a wire channel having a lattice shape is formed between the upper-layer dummy wire patterns.

6. A semiconductor device, comprising:

a memory cell array including a plurality of memory lines, the memory lines including a plurality of word lines or a plurality of bit lines, the bit lines crossing the word lines at right angles;

a plurality of wiring-prohibited regions formed on the memory cell array to cover at least part of the memory lines; and a signal line extending over the memory cell array through a wire channel formed between the wiring-prohibited regions, wherein:

the signal line is a metal line formed in the same layer which includes the wiring-prohibited regions and a route; and a route of the signal line is determined using an automatic wiring tool.

* * * * *